United States Patent
Bhattacharjee et al.

(10) Patent No.: US 9,733,366 B2
(45) Date of Patent: Aug. 15, 2017

(54) SYSTEM AND METHOD FOR CHARACTERIZING FOCUSED CHARGED BEAMS

(71) Applicant: INDIAN INSTITUTE OF TECHNOLOGY KANPUR, Kanpur (IN)

(72) Inventors: Sudeep Bhattacharjee, Kanpur (IN); Samit Paul, West Bengal (IN)

(73) Assignee: INDIAN INSTITUTE OF TECHNOLOGY KANPUR, Kanpur (IN)

(*) Notice: Subject to any disclaimer, the term of this patent is extended or adjusted under 35 U.S.C. 154(b) by 319 days.

(21) Appl. No.: 14/397,478

(22) PCT Filed: Apr. 16, 2013

(86) PCT No.: PCT/IB2013/053011
§ 371 (c)(1),
(2) Date: Oct. 27, 2014

(87) PCT Pub. No.: WO2013/160800
PCT Pub. Date: Oct. 31, 2013

(65) Prior Publication Data
US 2015/0041667 A1    Feb. 12, 2015

(30) Foreign Application Priority Data
Apr. 27, 2012  (IN) .................... 1301/DEL/2012

(51) Int. Cl.
*G01T 1/29* (2006.01)
*H01J 37/244* (2006.01)
*H01J 37/30* (2006.01)

(52) U.S. Cl.
CPC .......... *G01T 1/2921* (2013.01); *H01J 37/244* (2013.01); *H01J 37/30* (2013.01); *H01J 2237/24542* (2013.01)

(58) Field of Classification Search
USPC ................... 250/397, 310, 306, 307
See application file for complete search history.

(56) References Cited

U.S. PATENT DOCUMENTS

| 3,857,090 A | 12/1974 | Chick | |
| 4,647,909 A * | 3/1987 | Spalding | G11C 27/04 315/8.51 |
| 6,462,346 B1 * | 10/2002 | Kobinata | H01J 37/28 250/492.2 |

(Continued)

FOREIGN PATENT DOCUMENTS

WO     03019611 A1    3/2003

OTHER PUBLICATIONS

Davidson, S.M., "Rapid profile measurements in ion implanted silicon," Journal of Physics E: Scientific Instruments, 1972, vol. 5, No. 1, pp. 1-23.

(Continued)

*Primary Examiner* — Kiet T Nguyen
(74) *Attorney, Agent, or Firm* — Turk IP Law, LLC

(57) ABSTRACT

An apparatus for characterizing a focused charged beam is provided. The apparatus includes a plurality of parallel conducting channels and at least one current sensing unit configured to measure current across each of the plurality of parallel conducting channels.

20 Claims, 4 Drawing Sheets

(56) References Cited

U.S. PATENT DOCUMENTS

| | | | |
|---|---|---|---|
| 6,847,036 B1* | 1/2005 | Darling | H01J 49/025 250/291 |
| 7,282,834 B2 | 10/2007 | Kubena et al. | |
| 7,869,561 B2 | 1/2011 | Dafni | |
| 7,984,651 B2 | 7/2011 | Randall et al. | |
| 2003/0071223 A1 | 4/2003 | Hartley et al. | |
| 2006/0212977 A1* | 9/2006 | Otis | B82Y 10/00 700/90 |
| 2010/0188075 A1 | 7/2010 | Litvinov et al. | |
| 2010/0197117 A1 | 8/2010 | Li et al. | |
| 2012/0037802 A1 | 2/2012 | Kneedler | |

OTHER PUBLICATIONS

Frabboni, S. et al., "Ion and electron beam nanofabrication of the which-way double-slit experiment in a transmission electron microscope," Applied Physics Letters, 2010, vol. 97, No. 26, pp. 263101-263101-3.

Giannuzzia, L.A., and Stevie, FA, "A review of focused ion beam milling techniques for TEM specimen preparation," Micron, Jun. 1999, vol. 30, pp. 197-204.

Iida, et al., "Simple Profile Monitor for Low Intensity, Low-Duty Cycle Pulse Ion Beams," Review of Scientific Instruments, Sep. 1981, vol. 52, Issue 9, pp. 1328-1331.

International Search Report for International Application No. PCT/IB2013/053011 mailed on Sep. 27, 2013.

Ishitani, T., et al., "Proposals for exact-point transmission-electron microscopy using focused ion beam specimen-preparation technique," Journal of Vacuum Science & Technology B: Microelectronics and Nanometer Structures, Jul. 1998, vol. 16, Issue 4, pp. 2532-2537.

Jiang, X. et al., "Mini rf-driven ion sources for focused ion beam systems," Review of Scientific Instruments, Apr. 2003, vol. 74, Issue 4, pp. 2288.

Jung, K., et al., "Electrically induced conducting nanochannels in an amorphous resistive switching niobium oxide film," Applied Physics Letters, vol. 97, No. 23, 2010, pp. 233509-233509-3.

Krueger, R., "Dual-column (FIB-SEM) wafer applications," Micron Jun. 1999, vol. 30, Issue 3, pp. 221-226.

Lugstein, A., et al., "Current density profile extraction of focused ion beams based on atomic force microscopy contour profiling of nanodots," Journal of Applied Physics, Jun. 18, 2009, vol. 92, Issue 7, pp. 4037-4042.

Mathew, J.V. and Bhattacharjee, S., "Compact electrostatic beam optics for multi-element focused ion beams: Simulation and experiments," Review of Scientific Instruments, 2011, vol. 82, Issue 1, pp. 013501.

Mathew, J.V. et al., "Ion energy distribution near a plasma meniscus with beam extraction for multi element focused ion beams," Journal of Applied Physics, 2010, vol. 107, pp. 093306.

Mathew, J.V. et al., "Subcutoff microwave driven plasma ion sources for multielemental focused ion beam systems," Review of Scientific Instruments, 2008, vol. 79, Issue 6, pp. 063504-1-063504-5.

Nikawa, K., "Applications of focused ion beam technique to failure analysis of very large scale integrations: A review," Journal of Vacuum Science & Technology B, Sep. 1991, vol. 9, Issue 5, pp. 2566-2577.

Panitzsch, L. et al., "Direct high-resolution ion beam-profile imaging using a position-sensitive Faraday cup array," Review of Scientific Instruments, 2009, vol. 80, Issue 11, pp. 113302.

Raich, U., "Beam Diagnostics," Retrieved from the Internet URL: http://cas.web.cern.ch/CAS/Bulgaria-2010/Talks-web/Raich-Add-Text.pdf, on Sep. 19, 2014, pp. 1-49.

Strehl, P., "Beam Profile Measurements," Beam Instrumentation and Diagnostics Particle Acceleration and Detection, 2006, © Springer 2006, pp. 105-153.

Suchanska, M., et al., "Ion Beam Induced Luminescence of Alkali Halide Crystals," Physics Status Solidi B, Mar. 1, 1994, vol. 182, Issue 1, pp. 231-240.

Volinsky, A.A. et al., "FIB failure analysis of memory arrays," Microelectronic Engineering, Jul. 2004, vol. 75, Issue 1, pp. 3-11.

Young, R. J., "Micro-machining using a focused ion beam," Vacuum, Mar.-Apr. 1993, vol. 44, Issues 3-4, pp. 353-356.

\* cited by examiner

SYSTEM AND METHOD FOR CHARACTERIZING FOCUSED CHARGED BEAMS

CROSS-REFERENCE TO RELATED APPLICATIONS

This Application is the U.S. National Stage filing under 35 U.S.C. §371 of International Application No. PCT/IB2013/053011 filed on Apr. 16, 2013, which in turn claims priority under 35 U.S.C. §119(a) to Indian Application No. 1301/DEL/2012 filed on Apr. 27, 2012. The disclosures of the International application and the Indian application are hereby incorporated by reference in their entireties.

TECHNICAL FIELD

The present disclosure discloses an apparatus for characterizing a focused charged beam. The apparatus includes a plurality of parallel conducting channels and at least one current sensing unit configured to measure current across each of the plurality of parallel conducting channels.

BACKGROUND OF THE DISCLOSURE

Focused charged particle beams are known and are in use in a variety of nanoscience and technology applications such as micromachining and nanofabrication of semiconductor chips. Typically, applicability of focused charged beams for a specific use depends upon parameters such as beam energy and diameter of the beams. It is often desirable to measure flux and beam profile of an impinging beam at a substrate to obtain information regarding an interaction region of the impinging beam on the substrate along with amount of energy being delivered through the beam. Many applications today use submicron and nanofocused ion beams. However, characterizing submicron and nanofocused beams, particularly measuring their spatial profiles is extremely difficult.

Techniques and equipment for focused beam measurement have been developed over some time. One way of characterizing the beams is direct beam profile measurement that involves analysis of craters formed on a substrate due to interaction of an impinging focused beam with the surface of the substrate. However, beam profile measurement using this technique can only be used to obtain profiles of low energy ion beams. Moreover, the substrate to be analyzed is required to be replaced after each exposure to the focused beam. In addition, the absolute value of beam currents cannot be determined using this technique and it is cumbersome to ascertain profile of the beam owing to erosion of the substrate.

Certain other systems use two-dimensional Faraday cup array placed in the beam path to measure the beam currents. A Faraday cup is a detector that measures the current in a focused charged beam and typically includes a metal cup or housing mounted on an insulator. An array of Faraday cups is placed in the path of the focused charged beam and an electrical lead is attached that conducts the current to a measuring device. Unfortunately, a large number of Faraday cups may be required to measure the beam currents due to a finite size of each cup. In addition, this technique is limited to characterization of beams with diameter greater than 1 mm.

Another measurement technique uses a wire scanner to measure the currents and the beam profile. The wire scanner includes a thin straight wire formed of a light material that is passed through the beam to measure the beam profile. Again, this technique cannot be used to characterize submicron and nanofocused ion beams because of limitations posed by the wire diameter of the scanner.

SUMMARY

The foregoing summary is illustrative only and is not intended to be in any way limiting. In addition to the illustrative aspects, embodiments, and features described above, further aspects, embodiments, and features will become apparent by reference to the drawings and the following detailed description.

Briefly, in accordance with one aspect, an apparatus for characterizing a focused charged beam is provided. The apparatus includes a plurality of parallel conducting channels and at least one current sensing unit configured to measure current across each of the plurality of parallel conducting channels.

In accordance with another aspect, a system for characterizing a focused charged beam is provided. The system includes a beam generator configured to generate a focused charged beam along a beam path and at least one detector placed in the beam path. The detector includes an array of uniformly spaced conducting channels configured to generate current as the focused charged beam contacts the detector. The system also includes at least one current sensing unit electrically coupled to the detector to measure current generated across each of the conducting channels.

In accordance with another aspect, a method for characterizing a focused charged beam is provided. The method includes impinging the focused charged beam onto an array of parallel conducting channels placed in the path of the focused charged beam and measuring a current across each of parallel conducting channels to generate a beam profile of the focused charged beam.

In accordance with another aspect a detector is provided. The detector includes an array of conducting channels. Each of the conducting channels is configured to generate current as a focused charged beam contacts the conducting channels.

DETAILED DESCRIPTION

Figure 1:
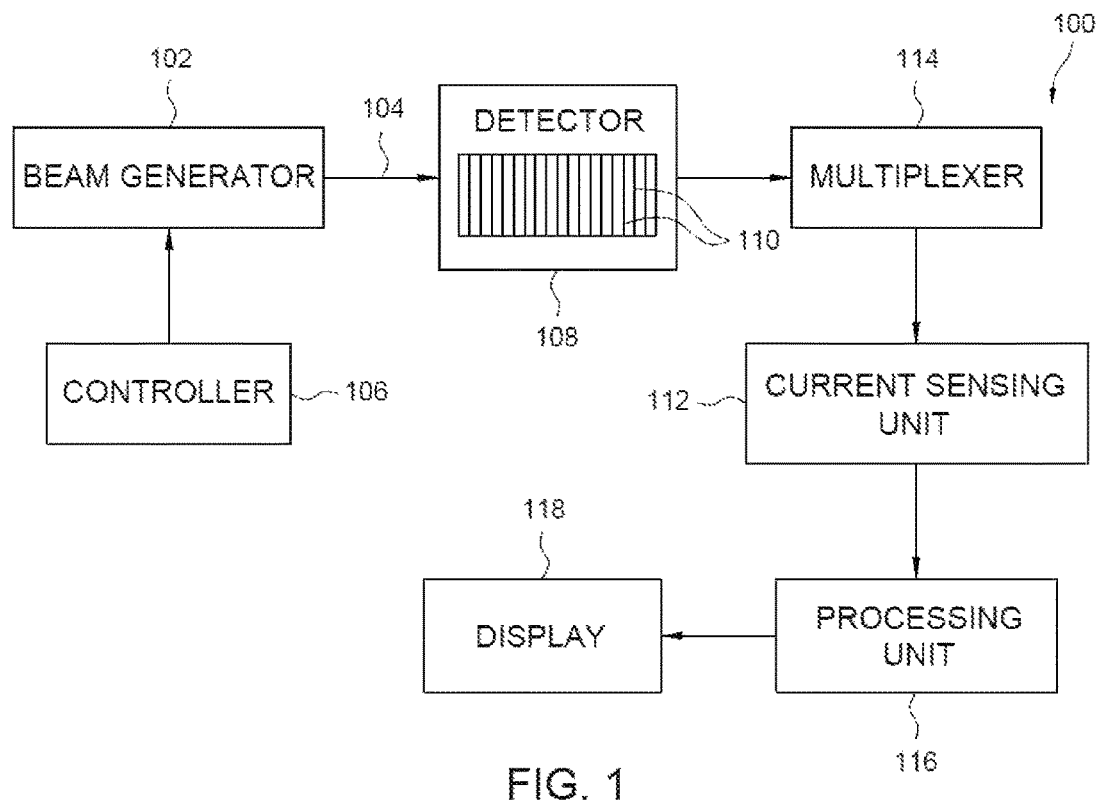
FIG. 1 is an example system for characterizing a focused charged beam in accordance with aspects of the present technique.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Example embodiments are generally directed to focused charged beams and methods of characterizing focused charged beams such as electron and ion beams. The technique facilitates rapid and accurate measurement of charged particle beam spatial profiles and current, particularly at submicron length scales.

Referring now to FIG. 1, system 100 for characterizing a focused charged beam is provided. The system 100 includes a beam generator 102 configured to generate a focused charged beam along a beam path 104. In one example embodiment, the focused charged beam includes an electron beam. In another example embodiment, the focused charged beam includes an ion beam. A controller 106 is electrically coupled to the beam generator 102 to control generation of the focused charged beam. The controller 106 is configured to control the positioning and focusing of the focused charged beam.

The system 100 further includes at least one detector 108 (also referred herein as a "spider probe") placed in the beam path 104. The detector 108 includes an array of uniformly spaced conducting channels generally represented by reference numerals 110. The conducting channels 110 are configured to generate current as the focused charged beam contacts the detector 108. The conducting channels may be formed of copper, silver, gold, tin, or combinations thereof. However, other suitable materials may be used.

In the illustrated embodiment, at least one current sensing unit 112 is electrically coupled to the detector 108 to measure current generated across each of the conducting channels 110. Moreover, the system 100 includes at least one multiplexer 114 configured to selectively couple each of the conducting channels 110 to the at least one current sensing unit 112 for measuring the current across the respective channel. In one example embodiment, the system 100 includes at least one microcontroller (not shown) to control the at least one multiplexer 114.

The system 100 further includes at least one processing unit 116 to generate a unidirectional beam profile of the focused charged beam based upon the measured current across each of the conducting channel 110. In the illustrated embodiment, the system 100 also includes at least one display 118 to display the measured current across the conducting channels 110 and the generated beam profile.

It should be noted that the present invention is not limited to any particular processor for performing the processing tasks of the invention. The term "processor," as that term is used herein, is intended to denote any machine capable of performing the calculations, or computations, necessary to perform the tasks of the invention. The term "processor" is intended to denote any machine that is capable of accepting a structured input and of processing the input in accordance with prescribed rules to produce an output.

Figure 2:
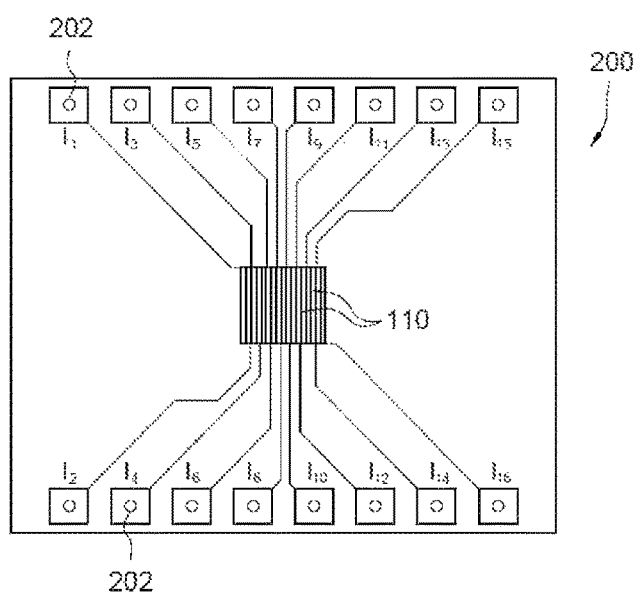
FIG. 2 is an example configuration of the detector of FIG. 1.

FIG. 2 illustrates an example configuration of the detector/spider probe 108 of FIG. 1. The detector 108 was fabricated by a computer controlled Printed Circuit Board machine. As illustrated, the detector 200 includes the plurality of conducting channels 110 placed in the beam path 104 (see FIG. 1) of the beam generated by the beam generator 102 (see FIG. 1). Each of the conducting channels 110 is configured to generate current as a focused charged beam contacts the conducting channels 110. Example materials for the conducting channels 110 include, but are not limited to, copper, silver, gold, tin, or combinations thereof in the illustrated embodiment, each of the plurality conducting channels 110 is electrically connected to the current sensing unit 112 (see FIG. 1) by a connection pad 202 of the respective conducting channel 110. The connection pad 202 may be formed of copper, silver, gold, tin, or combinations thereof.

It should be noted that a number and a size of the conducting channels 110 are selected based upon size of the focused charged beam to be characterized by the system 100. In certain example embodiments, the detector 200 may be used to characterize focused charged beams having a diameter of less than about 10 nanometers. In the illustrated embodiment, the plurality of conducting channels 110 are uniformly spaced apart and spacing between adjacent conducting channels 110 is selected based upon a desired measurement resolution.

In certain embodiments, a length of each of the plurality of conducting channels 110 is about 100 nanometers (nm) to about 1 centimeter (cm). Moreover, a width of each conducting channel 110 is about 10 nm to about 200 micrometers (μm). In some embodiments, the spacing between adjacent conducting channels 110 is about 10 nm to about 200 μm. As will be appreciated by those skilled in the art, the size and the spacing of the conducting channels 110 may be selected based upon the size of the beam to be characterized.

In certain example embodiments, the spacing between the conducting channels 110 is non-uniform. For example, in one embodiment, the spacing pattern has a gradient, where the spacing is small on one side, and gradually widens across the length of the detector 200. In this embodiment, the resolution of the detector 108 is determined based on the gradient of the spacing pattern of the conducting channels 110. In another embodiment, the detector 108 may include conducting channels 110 having a curved profile. A variety of such configurations may be envisaged.

In operation, each of the conducting channels 110 is selectively coupled to the current sensing unit 112 while grounding the other conducting channels. As each conducting channel 110 is coupled to the current sensing unit 112, the current across the respective channel is measured and such measured currents are used by the processing unit 116 (see FIG. 1) to generate a beam profile of the focused charged beam.

Figure 3:
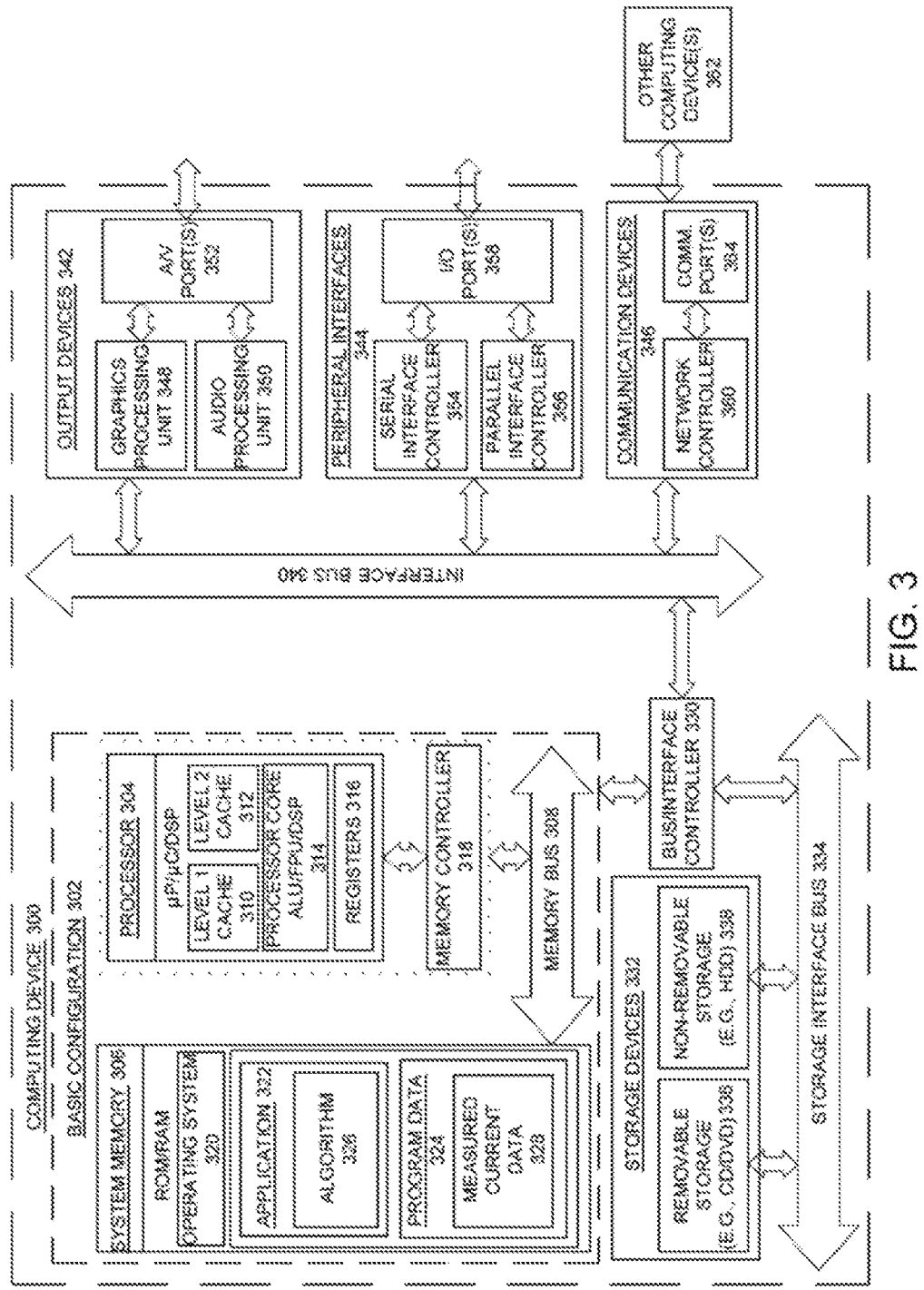
FIG. 3 is a block diagram illustrating an exemplary computing device that is arranged for characterizing a focused charged beam in accordance with aspects of the present technique.

FIG. 3 is a block diagram illustrating an example computing device 300 that is arranged for generating a beam profile of a focused charged beam in accordance with the present disclosure. In a very basic configuration 302, computing device 300 typically includes one or more processors 304 and a system memory 306. A memory bus 308 may be used for communicating between processor 304 and system memory 306.

Depending on the desired configuration, processor 304 may be of any type including but not limited to a microprocessor (μP), a microcontroller (μC), a digital signal processor (DSP), or any combination thereof. Processor 304 may include one or more levels of caching, such as a level one cache 310 and a level two cache 312, a processor core 314, and registers 316. An example processor core 314 may include an arithmetic logic unit (ALU), a floating point unit (FPU), a digital signal processing core (DSP core), or any combination thereof. An example memory controller 318 may also be used with processor 304, or in some implementations memory controller 318 may be an internal part of processor 304.

Depending on the desired configuration, system memory 306 may be of any type including but not limited to volatile memory (such as RAM), non-volatile memory (such as ROM, flash memory, etc.) or any combination thereof. System memory 306 may include an operating system 320, one or more applications 322, and program data 324. Application 122 may include an algorithm 326 that is arranged to characterize the focused beam as described with respect to system 100 of FIG. 1. Program data 324 may include measured current data 328 across the conducting channels 110 as is described herein. In some embodiments, application 322 may be arranged to operate with program data 324 on operating system 320 such that generation of beam profiles may be performed. This described basic configuration 302 is illustrated in FIG. 3 by those components within the inner dashed line.

Computing device 300 may have additional features or functionality, and additional interfaces to facilitate communications between basic configuration 302 and any required devices and interfaces. For example, a bus/interface controller 330 may be used to facilitate communications between basic configuration 302 and one or more data storage devices 332 via a storage interface bus 334. Data storage devices 332 may be removable storage devices 336, non-removable storage devices 338, or a combination thereof.

Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media may include volatile and non-volatile, removable and non-removable media implemented in any method or technology for storage of information, such as computer readable instructions, data structures, program modules, or other data.

System memory 306, removable storage devices 336 and non-removable storage devices 338 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 300. Any such computer storage media may be part of computing device 300.

Computing device 300 may also include an interface bus 340 for facilitating communication from various interface devices (e.g., output devices 342, peripheral interfaces 344, and communication devices 346) to basic configuration 302 via bus/interface controller 330. Example output devices 342 include a graphics processing unit 348 and an audio processing unit 350, which may be configured to communicate to various external devices such as a display or speakers via one or more A/V ports 352.

Example peripheral interfaces 344 include a serial interface controller 354 or a parallel interface controller 356, which may be configured to communicate with external devices such as input devices (e.g., keyboard, mouse, pen, voice input device, touch input device, etc.) or other peripheral devices (e.g., printer, scanner, etc.) via one or more I/O ports 358. An example communication device 346 includes a network controller 360, which may be arranged to facilitate communications with one or more other computing devices 362 over a network communication link via one or more communication ports 364.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 300 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 300 may also be implemented as a personal computer including both laptop computer and non-laptop computer configurations.

The example methods described above provide an apparatus for performing rapid measurements of focused charged beam profiles, particularly at submicron levels. The apparatus includes a detector with unidirectional array of micro fabricated conducting channels with interstitial insulated layers placed in the beam path of the focused charged beam. The current across the conducting channels is measured to capture flux of current of the focused beam and the measured current data is used to generate a one-dimensional spatial beam profile. The apparatus may be used to measure focused charged beams having a wide range of diameters by adjusting the size of the detector. Moreover, the apparatus described above may be used to measure positive as well as negative ion beam profiles of any ionic species.

The technique described above may be used for measurement of focused ion and electron beams and is particularly advantageous for nanoscience and technology applications that require application of submicron to nanofocused electron and ion beams.

EXAMPLES

The present invention will be described below in further detail with examples and comparative examples thereof, but it is noted that the present invention is by no means intended to be limited to these examples.

Example 1

Configuration of a System for Characterizing a Focused Charged Beam

Figure 4:
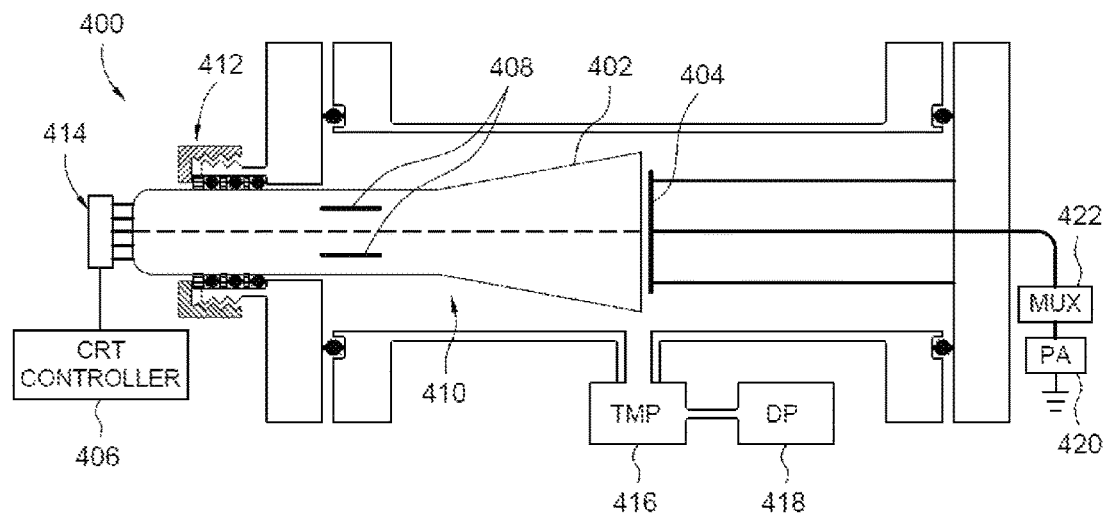
FIG. 4 is an example configuration of the system used for characterizing a focused charged beam.

FIG. 4 is an example configuration 400 of the system used for characterizing a focused charged beam. A cathode ray tube (CRT) 402 was used to generate a focused electron beam having a diameter of about 1 mm. As illustrated, a detector 404 was placed in the path of electron beam generated by the CRT 402. The detector 404 included sixteen parallel silver coated copper channels. The length of each channel was about 6.4 mm and width of each channel was about 200 μm. Moreover, the channels were spaced at a uniform spacing of about 200 μm and were electrically connected to respective connection pads.

The scintillation screen of the CRT 402 was removed to allow the electron beam to impinge on the center of the detector 404. A CRT controller 406 electrically connected to the CRT was used to control the positioning and focusing of the electron beam generated by the CRT 402. Further, position of the beam generated from the CRT 402 was controlled by applying voltage on X-Y deflection plates 408 using the CRT controller 406. The CRT 402 was installed within a vacuum chamber 410 and was oriented such that axes of the CRT 402 and the vacuum chamber 410 were coaxial. A Wilson seal 412 was used to attach the CRT 402 with the vacuum chamber 410 to prevent any leakage. The CRT 402 was placed within the vacuum chamber 410 such that electrical connections 414 located at a backside of the CRT 402 were accessible from outside of the vacuum chamber 410.

The pressure inside the vacuum chamber 410 was maintained at about $1 \times 10^{-7}$ Torr using a turbo molecular pump 416 backed by an oil free diaphragm pump 418. In operation, current through each of the channels of the detector 404 was measured as the electron beam from the CRT 402 contacted the detector 404. Here, copper wires having a thickness of about 0.4 mm were soldered to connection pads of the detector 404 and to a Keithley picoammeter 420 through a microcontroller controlled analog multiplexer 422. The multiplexer 422 selectively coupled each channel to the picoammeter 420 at a time while grounding the other channels for measuring current through the respective channel.

Example 2

Current Measurements Corresponding to Channels of the Detector of the System of Example 1

Figure 5:
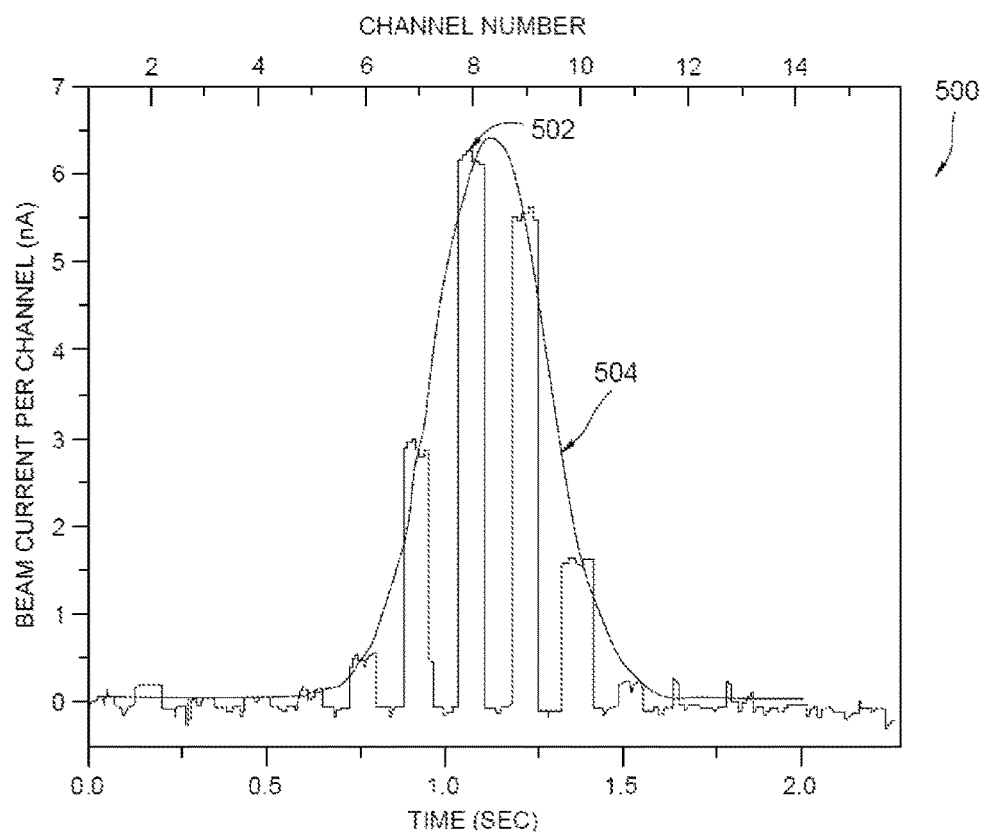
FIG. 5 is a graphical representation of current measured across each channel of the detector used in the system of FIG. 4.

FIG. 5 is a graphical representation 500 of current measured across each channel of the detector 404 of Example 1. The measured currents are plotted with respect to measurement time for each channel. As can be seen, the measured current is maximum across channel number eight of the detector 404. The experimentally obtained real time currents are shown by lines 502. A Gaussian curve 504 was fitted through the measured current data. The curve 504 had a full width at half maximum (FWHM) measured at about 0.96 mm. It should be noted that the measured size of the focused electron beam was substantially same as the actual beam spot size on the scintillation screen of the CRT 402.

Example 3

Characterizing a Focused Charged Beam Generated by a Microwave Plasma Source

The detector 404 may measure any incoming beam, either an electron beam or an ion beam. The ion beam may be from any type of ion source, for example, a plasma source or a liquid metal source. The plasma may be generated by a direct current, a radio frequency, or a microwave source.

A microwave plasma source was used to generate a focused electron beam instead of a CRT. The detector 404 was placed in the path of electron beam generated by the plasma source. The detector 404 included sixteen parallel silver coated copper channels. The length of each channel was about 6.4 mm and width of each channel was about 200 μm. Moreover, the channels were spaced at a uniform spacing of about 200 μm and were electrically connected to respective connection pads.

An argon ion beam was extracted from the plasma source using an extraction system consisting of a grounded plasma electrode having 1.5 mm aperture and a puller electrode biased at −1 kV potential having 1 mm aperture. The puller electrode accelerated the beam towards the detector 404. The ion beam was then made to fall on the detector 404 kept at a distance 1 cm away from the puller electrode.

Example 4

Current Measurements Corresponding to Channels of the Detector of the System of Example 3

Figure 6:
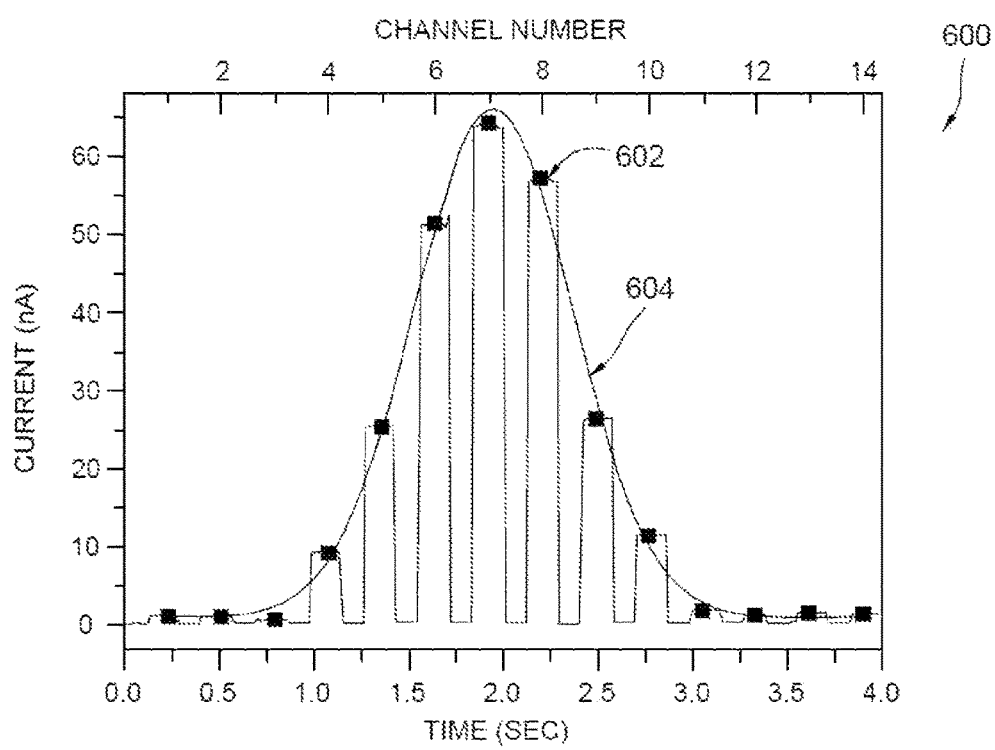
FIG. 6 is a graphical representation of current measured across each channel of the detector using a microwave plasma source.

FIG. 6 is a graphical representation 600 of current measured across each channel of the detector 404 of Example 3. The measured currents are plotted with respect to measurement time for each channel. As can be seen, the measured current is maximum across channel number seven of the detector 404. The experimentally obtained real time currents are shown by lines 602. A Gaussian curve 604 was fitted through the measured current data. The curve 604 had a full width at half maximum (FWHM) measured at about 1.39 mm. It should be noted that the measured size of the focused electron beam was substantially same as the actual beam spot size generated by the plasma source.

Example 5

Current Measurements Corresponding to Channels of the Detector of the System of Example 3

Figure 7:
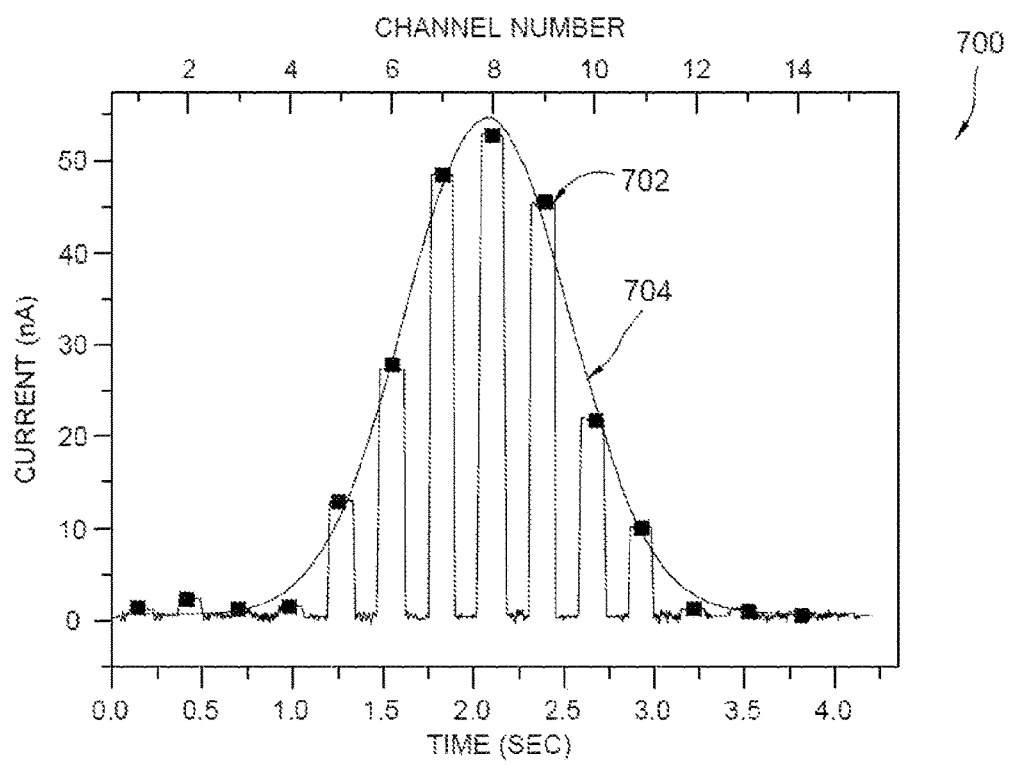
FIG. 7 is another graphical representation of current measured across each channel of the detector using the microwave plasma source.

FIG. 7 is another graphical representation 700 of current measured across each channel of the detector 404 of Example 3. The measured currents are plotted with respect to measurement time for each channel. As can be seen, the measured current is maximum across channel number eight of the detector 404. The experimentally obtained real time currents are shown by lines 702. A Gaussian curve 704 was fitted through the measured current data. The curve 704 had a full width at half maximum (FWHM) measured at about 1.52 mm. It should be noted that the measured size of the focused electron beam was substantially same as the actual beam spot size generated by the plasma source. It should further be noted that the beam that was obtained from the plasma source in the examples 4 and 5 was different and hence resulted in different FWHMs.

Example 6

Method of Fabricating a Smaller Size Detector

A detector of a smaller size, for example, of around 45 μm size may be made by an optical lithography machine. It may be made out of a substrate of area of about 3×3 cm². The substrate may be cleaned and may uniformly be coated with SU-8 2008, an epoxy-based negative photoresist, by spin coating. The spin coating may be carried out at about 3000 rpm for about 1 minute to result in a uniform thin layer, with uniformity of within 5 to 10 nanometers. The photo resist-coated substrate may then be prebaked to drive off excess photoresist solvent at about 95° C. for about 30 minutes.

A picture of the pattern of the detector may be drawn in Microsoft Windows® Paint and may be fed to the optical lithography machine. The substrate then may be exposed to the UV light and post baked in a hot air oven for about 5 minutes at 95° C.

The substrate may be developed in 1-methoxy-2-propyl acetate (SU-8 developer) for about 1 minute. The substrate may then be dried using a flow of dust-free air. Any desired metal may be deposited on top of the substrate and the unwanted metal may be removed using acetone. A wire bonder machine may be used to connect different channels with the wire terminal. As described above, the present technique for characterizing focused charged beams facilitates rapid measurement of focused charged beam profiles of submicron size with substantially high resolution. The present system can be used to measure electron beams and positive as well as negative ion beams along focused beam lines. The detector described above facilitates in situ measurement of focused ion and electron beams such as used in a variety of nanoscience applications such as sample preparation for TEM, surface analysis, mask modification and correction, defect characterization, among others.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the an from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present.

For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.).

It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As anon-limiting example, each range discussed herein can be readily broken down into a lower third, middle third and upper third, etc.

As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. An apparatus to characterize a focused charged beam, the apparatus comprising:
   a plurality of non-uniformly-spaced conductive channels placed in a path of the focused charged beam; and
   at least one current sensor unit configured to measure current across each conductive channel of the plurality of non-uniformly-spaced conductive channels.

2. The apparatus of claim 1, further comprising a multiplexer configured to selectively couple each conductive channel of the plurality of non-uniformly-spaced conductive channels to the at least one current sensor unit to measure the current across the conductive channel.

3. The apparatus of claim 2, further comprising at least one microcontroller configured to control the multiplexer.

4. The apparatus of claim 1, further comprising at least one processor unit configured to generate a profile of the focused charged beam based upon the measured current across each conductive channel of the plurality of non-uniformly-spaced conductive channels.

5. The apparatus of claim 1, wherein the plurality of non-uniformly-spaced conductive channels are formed of copper, silver, gold, tin, or combinations thereof.

6. The apparatus of claim 1, wherein a number and a size of the plurality of non-uniformly-spaced conductive channels are selected based upon a size of the focused charged beam.

7. The apparatus of claim 1, wherein a spacing between an adjacent pair of conductive channels of the plurality of non-uniformly-spaced conductive channels is selected based upon a particular measurement resolution.

8. The apparatus of claim 1, wherein the apparatus is configured to characterize focused charged beams having a diameter of less than about 10 nanometers.

9. The apparatus of claim 1, wherein:
the plurality of non-uniformly-spaced conductive channels comprises a first conductive channel, which is adjacent to a second conductive channel;
the second conductive channel is adjacent to a third conductive channel; and
a first spacing between the first conductive channel and the second conductive channel is greater than a second spacing between the second conductive channel and the third conductive channel.

10. The apparatus of claim 1, wherein:
the plurality of non-uniformly-spaced conductive channels comprises a plurality of pairs of adjacent conductive channels, wherein each pair of the adjacent conductive channels has a spacing between the adjacent conductive channels; and
each spacing between the adjacent conductive channels is greater than a spacing to its left.

11. The apparatus of claim 1, wherein a spacing pattern of the non-uniformly-spaced conductive channels provides a gradient.

12. The apparatus of claim 1, wherein the plurality of non-uniformly-spaced conductive channels are parallel.

13. The apparatus of claim 1, wherein at least one conductive channel of the plurality of non-uniformly-spaced conductive channels has a curved profile.

14. A system to characterize a focused charged beam, the system comprising:
a beam generator configured to generate the focused charged beam along a beam path;
at least one detector placed in the beam path, wherein the at least one detector comprises an array of non-uniformly-spaced conductive channels configured to generate current as the focused charged beam contacts the at least one detector; and
at least one current sensor unit, electrically coupled to the at least one detector, to measure the current generated across each conductive channel of the non-uniformly-spaced conductive channels.

15. The system of claim 14, further comprising at least one multiplexer configured to selectively couple each conductive channel of the non-uniformly-spaced conductive channels to the at least one current sensor unit to measure the current across the conductive channel.

16. The system of claim 14, further comprising at least one processor unit configured to generate a unidirectional beam profile of the focused charged beam based upon the measured current across each conductive channel of the non-uniformly-spaced conductive channels.

17. The system of claim 16, further comprising at least one display unit configured to display the measured current across each conductive channel of the non-uniformly-spaced conductive channels and to display the generated unidirectional beam profile.

18. A detector, comprising:
an array of non-uniformly spaced conductive channels configured to be placed in a path of a focused charged beam, wherein each conductive channel of the non-uniformly-spaced conductive channels is configured to generate current as the focused charged beam contacts the conductive channel.

19. The detector of claim 18, further comprising at least one current sensor unit configured to measure the current across each conductive channel of the non-uniformly-spaced conductive channels.

20. The detector of claim 19, further comprising at least one processor unit configured to generate a unidirectional beam profile of the focused charged beam based upon the measured current.

* * * * *

UNITED STATES PATENT AND TRADEMARK OFFICE
CERTIFICATE OF CORRECTION

PATENT NO. : 9,733,366 B2
APPLICATION NO. : 14/397478
DATED : August 15, 2017
INVENTOR(S) : Bhattacharjee et al.

Page 1 of 1

It is certified that error appears in the above-identified patent and that said Letters Patent is hereby corrected as shown below:

In the Specification

In Column 2, Line 36, delete "aspect a" and insert -- aspect, a --, therefor.

In Column 4, Lines 8-9, delete "thereof in" and insert -- thereof. In --, therefor.

In Column 9, Line 30, delete "an" and insert -- art --, therefor.

In Column 10, Line 41, delete "anon-limiting" and insert -- a non-limiting --, therefor.

Signed and Sealed this
Fifth Day of December, 2017

Joseph Matal
*Performing the Functions and Duties of the
Under Secretary of Commerce for Intellectual Property and
Director of the United States Patent and Trademark Office*